(12) United States Patent
Lu

(10) Patent No.: US 6,901,570 B2
(45) Date of Patent: May 31, 2005

(54) METHOD OF GENERATING OPTIMUM SKEW CORNERS FOR A COMPACT DEVICE MODEL

(75) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 10/096,169

(22) Filed: Mar. 12, 2002

(65) Prior Publication Data

US 2003/0188280 A1 Oct. 2, 2003

(51) Int. Cl.$^7$ .............................................. G06F 17/50
(52) U.S. Cl. ......................................... 716/6; 703/13
(58) Field of Search ........................... 716/6, 2; 703/13

(56) References Cited

U.S. PATENT DOCUMENTS

| | | | |
|---|---|---|---|
| 4,550,084 A | 10/1985 | Nelson et al. | |
| 5,264,738 A | 11/1993 | Veendrick et al. | |
| 5,507,029 A | 4/1996 | Granato et al. | |
| 5,692,165 A | 11/1997 | Jeddeloh et al. | |
| 5,740,347 A | 4/1998 | Avidan | |
| 5,754,826 A | 5/1998 | Gamal et al. | |
| 5,790,436 A | 8/1998 | Chen et al. | |
| 5,857,095 A | 1/1999 | Jeddeloh et al. | |
| 5,896,300 A | 4/1999 | Raghavan et al. | |
| 5,999,032 A | 12/1999 | Wang et al. | |
| 6,018,623 A | * 1/2000 | Chang et al. ................... | 716/6 |
| 6,560,755 B1 | * 5/2003 | Zhang et al. ................... | 716/4 |

OTHER PUBLICATIONS

C. Visweswariah, Optimization Techniques for High–Performance Digital Circuits, IEEE/ACM International Conference on Computer–Aided Design, pp. 198–207, Nov. 1997.*

A. Conn et al., JiffyTune: Circuit Optimization Using Time–Domain Sensitivities, IEEE Transactions on Computer–Aided Design Of Integrated Circuits and Systems, pp. 1292–1309, Dec. 1998.*

O.S. Nakagawa et al., Circuit Impact and Skew–Corner Analysis of Stochastic Process Variation in Global Interconnect, 1999 IEEE International Conference on Interconnect Technology, pp. 24–26, May 1999.*

D. Sylvester et al., Analytical Modeling and Characterization of Deep–Submicrometer Interconnect, Proceedings of the IEEE, vol. 89, Issue 5, pp. 634–664, May 2001.*

Soo–Young Oh et al., Interconnect Modeling for VLSIs, International Conference on Simulation of Semiconductor Processes and Devices, pp. 203–206, Sep. 1999.*

Chang, et al., "Fast Generation of Statistically–based Worst–Case Modeling of On–Chip Interconenct," Proceedings of the 1997 International Conference on Computer Design (ICCD '97), 1997 Institute of Electrical and Electronics Engineers, Inc. http://www.computer.org/proceedings/iccd/8206/82060720abs.htm, last updated Apr. 30, 2001, p. 1.

"Stochastic interconnect modeling overview," http://bandgap.eecs.berkeley.edu/~dennis/stochastic_excerpt.html; last updated Apr. 30, 2001, pp. 1–2.

A.D. Savkar, "Random Delay Simulation," IBM Technical Disclosure Bulletin, vol. 19. No. 11, Apr. 1977, pp. 4257–4258.

R. N. Ames, et al., "Accurate Proportional Variable Stress Testing Hardware Logic Design Using Software Simulation," IBM Technical Disclosure Bulletin, vol. 20, No. 1, Jun. 1977, pp. 6–8.

* cited by examiner

Primary Examiner—A. M. Thompson
(74) Attorney, Agent, or Firm—Scully, Scott, Murphy & Presser; Richard M. Kotulak, Esq.

(57) ABSTRACT

A method of generating optimum skew corner models for a compact device model. A skew corner model refers to a fast or a slow device model, or even a fast-NFET slow-PFET model in which there is no continuos distribution for compact device model parameters. A model parameter's values are set so that the model will reproduce the fast or slow corner results of several circuits performance targets, and wherein each model parameter's value in the skew corner library is within the tolerance range of that model parameters.

19 Claims, 4 Drawing Sheets

METHOD OF GENERATING OPTIMUM SKEW CORNERS FOR A COMPACT DEVICE MODEL

BACKGROUND OF THE INVENTION

1. Field of the Invention

The present invention relates generally to a method of generating optimum skew corners for a compact device model, and more particularly pertains to method of generating a fast or slow skew corner model, or a fast-NFET, slow-PFET skew corner model, in which each of the parameters of compact device model is fixed to a particular value within its process distribution. A model parameter's values are set so that the model will reproduce the fast or slow corner results of several circuits performance targets, and wherein each model parameter's value in the skew corner library is within the tolerance range of that model parameter.

2. Discussion of the Prior Art

A compact device model in the semiconductor industry includes one or more of the following items: an FET device model (BSIM3, BSIM4, BSIMPD, Gummel-Poon, VBIC, etc.), models on passive devices (resistors, capacitors, inductors, etc.), and interconnect models. The compact model in the semiconductor industry plays an important role in linking a semiconductor device/chip manufacturer with circuit design companies or design teams. Circuit designers use a compact device model in a circuit simulator, such as IBM'S AS/X simulator, PowerSpice simulator, vendor's HSPICE simulator, SmartSpice simulator, Spectre simulator, etc. A typical compact model contains both nominal values of various model parameters as well as their standard deviations (i.e., 1-$\sigma$ tolerance).

For an FET model, typical model parameters include TOX (oxide thickness), $\Delta L$ (difference between FET drawn design length and actual length), $\Delta W$ (difference between FET drawn design width and actual width), $V_T$ (threshold voltage), mobility, Cj (junction capacitance), etc. For a passive device such as a resistor, typical model parameters include sheet resistance of the resistor, its temperature coefficients, and the resistor's length and width, etc. For an interconnect model, typical model parameters include wire length, wire width, wire thickness, wire-to-wire space in the same metal level, vertical distance to a metal level above, and the vertical distance to a metal level below or to a substrate/N-well/diffusion region below it, etc.

With such nominal and tolerance values of model parameters, a circuit designer can do Monte Carlo simulations to obtain both nominal performance of a circuit and n-$\sigma$ (e.g., 1-$\sigma$, 3-$\sigma$, or 6-$\sigma$, etc.) worst-case performance or n-$\sigma$ best-case performance of the circuit. However, a practical limitation with the Monte Carlo simulation method is the huge CPU time required. The reason is that a single circuit simulation may take hours of intensive CPU time, and many times of circuit simulation are required to obtain a meaningful statistical sample.

To save circuit simulation time, for circuit designers, it is often desirable to have a worst-case (best-case) skew-corner library for simulating the worst-case (best-case) behavior of the circuit. This saves a lot of circuit simulation time, since only a single simulation is needed to obtain the worst-case circuit performance number with the use of a worst-case skew-corner library.

A commonly used skew corner method is to shift all model parameters together, i.e., shift them in the same percentage with respect to each model parameter's standard deviation. As explained hereinbelow, such a method usually does not produce an optimum skew corner for a single performance target. For multiple performance targets, such a single skew corner typically will not reproduce the worst case (or best case) performance results of several circuits (e.g., FET currents, ring oscillator periods and NAND gate delay, or worst product of RC and worst R in an interconnect model) simultaneously.

In other words, a problem on skew corner is:

Given that the nominal and tolerance values of all model parameters in a compact device model have been determined, how to provide a fast skew model or a slow skew model in which there is no distribution for any compact model parameters. Specifically, how to set a model parameter's values so that the model will reproduce the fast or slow corner results of several circuits performance targets.

SUMMARY OF THE INVENTION

Accordingly, it is a primary object of the present invention to provide a method of generating optimum skew corners for a compact device model.

A further object of the subject invention is the provision of a method of generating a fast or slow skew corner model in which there is no distribution for a compact device parameters. A model parameter's values are set so that the model will reproduce the fast or slow corner results of several circuits performance targets, and wherein each model parameter's value in the skew corner library is within the tolerance range of that model parameter.

BRIEF DESCRIPTION OF THE DRAWINGS

The foregoing objects and advantages of the present invention for a method of generating optimum skew corners for a compact device model may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE DRAWINGS

Figure 1:
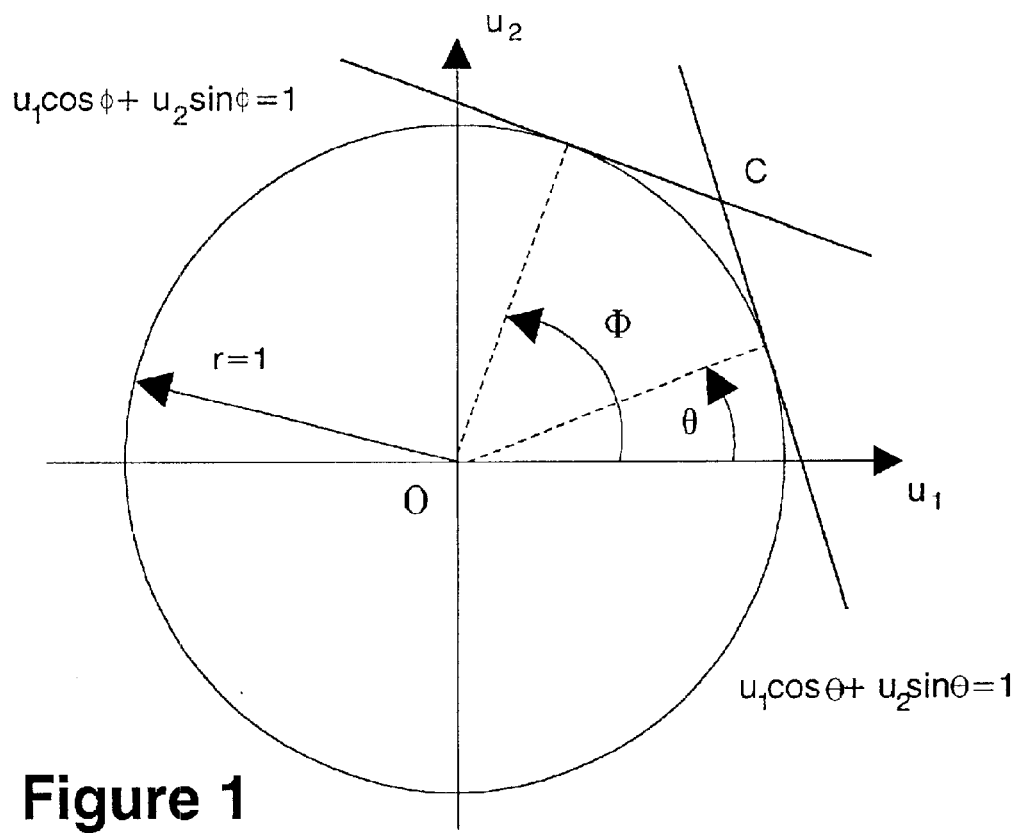
FIG. 1 illustrates that the cross point C of the two straight lines plotted satisfies $$0<\cos\phi<u_1(C)<\cos\theta<1 \text{ and } 0<\sin\theta<u_2(C)<\sin\phi<1.$$

The following provides a solution to the problem discussed above, based on a first-order approximation. It should be noted that similar solutions based on a second-order approximation can also be provided. But they are quite lengthy, and are omitted here. The best way to provide a second-order solution is in the form of computer software. The first-order solution can help us understand the methodology used. Also, the first-order solution will serve as the initial solution to a set of non-linear (say, quadratic) equations.

In the original coordinate system. For a given compact device model and given nominal values $X_{10}, X_{20}, \ldots, X_{M0}$ of M compact model parameters $X_1, X_2, \ldots, X_M$, obtain a first-order approximation for a performance target around the above given nominal operating point. Assume that there are N such performance targets, and denote the ith target by $F_j$. The first-order Taylor series expansion for the function $F_j(X_1, X_2, \ldots, X_M)$ is $$F_i(x_1, x_2, \ldots, x_M) = F_{i0} + \sum_{j=1}^{M} a_{ij}(x_j - x_{j0}), \quad i = 1, 2, \ldots, N, \quad (1)$$

where the coefficients $a_{ij}$ (j=1, 2, ..., M) can be obtained either from expanding the model equations (say, equations for FET current or equations for a resistor's resistance) at the operating point $(X_{10}, X_{20}, \ldots, X_{M0})$ directly, or from evaluating the model at $(X_{10}, X_{20}, \ldots, X_{j0}+n\sigma_j, \ldots, X_{M0}$ (i.e., doing a sensitivity analysis):

$$a_{ij} = [F_j(X_{10}, X_{20}, \ldots, X_{j0}+n\sigma_j, \ldots, X_{M0}) - F_{10}]/(n\sigma_j), j=1, 2, \ldots, M,$$

where $F_{j0} = F_j(X_{10}, X_{20}, \ldots, X_{j0}, \ldots, X_{M0})$, and n can be 1, −1, 2, −2, 3, −3, or many other discrete values. Practically, the coefficient $a_{ij}$ indicates how sensitive the target $F_i$ is with respect to the change in the model parameter $X_j$.

Let $\sigma_j$ be the standard deviation (i.e., 1-σ tolerance) of jth model parameter $X_j$. Then the joint probability for parameters $X_1, X_2, \ldots, X_M$ is (assuming that $X_1, X_2, \ldots, X_M$ are statistically independent of each other):

$$P(x_1, x_2, \ldots, x_M) = const \cdot \exp\left[-\frac{1}{2}\sum_{j=1}^{M} \frac{(x_j - x_{j0})^2}{\sigma_j^2}\right] \quad (2)$$

Using the distribution (2), it is easy to verify some average values:

$$<X_j> = X_{j0}, <(X_j - X_{j0})^2> = \sigma_j^2, j=1, 2, \ldots, M$$

$$<(X_j - X_{j0})(X_l - X_{l0})> = 0, j \neq l, j,l=1,2, \ldots, M$$

Using them, find the average value of the ith target, $$<F_i> = F_{i0}, i=1, 2, \ldots, N$$

and the variance of the ith target, $$\sum_{i}^{2} \equiv \langle F_i^2 \rangle - \langle F_i \rangle^2 = \sum_{j=1}^{M} a_{ij}^2 \sigma_j^2, \quad i = 1, 2, \ldots, N \quad (3)$$

Relation (3) links the standard deviations $\Sigma_i$ of the circuit performance targets to the standard deviations $\sigma_j$ of the compact model parameters.

1-σ Worst-Worst Case (or 1-σ Best-Best Case):

The so-called 1-σ worst-worst case (or best-best case) is obtained by setting all model parameters to their respective 1-σ worst (or best) case value:

$$F_i(X_{10} \pm \sigma_1, X_{20} \pm \sigma_2, \ldots, X_{M0} \pm \sigma_M) =$$

$$F_{i0} \pm \sum_{j=1}^{M} |a_{ij}| \sigma_j, \quad i = 1, 2, \ldots, N,$$

which is much more off than 1-σ worst case (or best case). The reason is that $$\sum_{j=1}^{M} |a_{ij}| \sigma_j > \sum_{i} = \left(\sum_{j=1}^{M} a_{ij}^2 \sigma_j^2\right)^{\frac{1}{2}}$$

To see this, square the left hand side of the above inequality, and obtain $$\left(\sum_{j=1}^{M} |a_{ij}| \sigma_j\right)^2 =$$

$$\left(\sum_{j=1}^{M} |a_{ij}| \sigma_j\right)\left(\sum_{l=1}^{M} |a_{il}| \sigma_l\right) = \sum_{j=1}^{M} a_{ij}^2 \sigma_j^2 + \sum_{j,l=1, j\neq l}^{M} |a_{ij} a_{il}| \sigma_j^2$$

namely, $$\left(\sum_{j=1}^{M} |a_{ij}| \sigma_j\right)^2 = \sum_{i}^{2} + \sum_{j,l=1, j\neq l}^{M} |a_{ij} a_{il}| \sigma_j^2 > \sum_{i}^{2}$$

To get an understanding on how much off the worst-worst case (or best-best case) is, examine a special case. When each parameter gives the same contribution $\Sigma_j$, i.e., $$|a_{ij}|\sigma_j=|a_{i1}|\sigma_1, j=2,3, \ldots, M$$

we find that $$\sum_{i} = \sqrt{M} |a_{i1}| \sigma_1, \quad i = 1, 2, \ldots, N$$

and thus $$F_i(X_{10} \pm \sigma_1, X_{20} \pm \sigma_2, \ldots, X_M \pm \sigma_M) =$$

$$F_{i0} \pm M |a_{i1}| \sigma_1 = F_{i0} \pm \sqrt{M} \sum_{i}, \quad i = 1, 2, \ldots, N$$

The above discussion shows quantitatively why one can not get the best/worst case solution by simply skewing all model parameters to their respective best/worst skew corner. It also indicates that, in order to reach the best/worst case solution, the model parameters should take values within their respective tolerance range $(X_{j0}-\sigma_j, X_{j0}+\sigma_j)$.

In a normalized coordinate system. First introducing normalized sensitivity coefficients $$\alpha_{ij} = \frac{a_{ij}\sigma_j}{\sum_i}, \quad i = 1, 2, \ldots, N, \quad j = 1, 2, \ldots, M \quad (4)$$

we find that each equation in Eqs. (3) can be recast to a form of a unit length vector, $$\sum_{j=1}^{M} \alpha_{ij}^2 = 1, \quad i = 1, 2, \ldots N \quad (5a)$$

Equation (5a) shows that each normalized sensitivity coefficient is within −1 and 1, $$-1 \leq \alpha_{ij} \leq 1, i=1,2,\ldots, N j=1,2,\ldots, M \quad (5b)$$

Next introduce a shifted-and-scaled coordinate system, $$u_j = (X_j - X_{j0})/\sigma_j \quad (6)$$

which is dimensionless. Notice that $u_j=1$ corresponds to $X_j=X_{j0}+\sigma_j$. Also, $|u_j|<1$ corresponds to the model parameter $X_j$ within its tolerance range: $X_{j0}-\sigma_j < X_{j0}+\sigma_j$. In terms of the dimensionless, shifted-and-scaled coordinates, the joint probability distribution (2) becomes $$P(u_1, u_2, \ldots, u_M) = \text{const} \cdot \exp\left(-\frac{1}{2}\sum_{j=1}^{M} u_j^2\right) \quad (7)$$

The 1-σ best/worst case of $F_j$ is either $$\left(F_{i0} + \sum_i\right) \text{ or } \left(F_{i0} - \sum_i\right).$$

To be clear, denote $$F_i = F_{i0} + \eta_i \sum_i$$

with $\eta_i$ being 1 or −1. Substituting Eq. (6) into Eq. (1), in order to reach the best/worst cases of N performance targets $F_j$ (i=1, 2, ..., N) simultaneously, the following conditions have to be satisfied simultaneously, $$\sum_{j=1}^{M} a_{ij}\sigma_j u_j = \eta_i \sum_i, \quad i = 1, 2, \ldots, N \quad (8a)$$

The difference and similarity between Eqs. (8a) and (3) should be noticed. Making use of Eqs. (4) in Eq. (8a), obtain a simpler form of Eq. (8a), $$\sum_{j=1}^{M} \alpha_{ij} u_j = \eta_i \quad i = 1, 2, \ldots, N \quad (8b)$$

See what happens if we need to provide N separate skew corners, i.e., one skew corner for the best/worst case value of target $F_1$ only, and another skew corner for the best/worst case value of target $F_2$ only, etc. By comparing Eq. (8b) with Eq. (5a), we know that $$u_j = \eta_i \alpha_{ij} = \eta_i \frac{a_{ij}\sigma_j}{\sum_i}, \quad j = 1, 2, \ldots, M \quad (9)$$

are a set of solutions. Since $\eta_i$ is either 1 or −1, it is easy to see from Eq. (5b) that $-1 \leq u_j \leq 1$. [Certainly, these are NOT unique solutions, since there are M variables but there is only one constraint.] Using Eq. (5a) and noting that $\eta_i$ is either 1 or −1, we get the following unit-length-vector relation for the skew corner solution in Eq. (9), $$\sum_{j=1}^{M} u_j^2 = 1 \quad (10)$$

The following discussion assumes that the best/worst cases of N performance targets $F_j$ (i=1, 2, ..., N) are obtained simultaneously. Geometrically, each equation in Eq. (8b) (which contains N equations) represents a plane in an M-dimensional space whose distance to the center of the shifted and scaled coordinate system is 1, and the normal direction of the plane is, $(\alpha_{i1}, \alpha_{i2}, \ldots, \alpha_{iM})$ for the ith target. In other words, each plane is tangent to a unit sphere in the M-dimensional space. FIG. 1 illustrates this in the case of M=2, i.e., on a two-dimensional plane, in which the unit sphere reduces to a unit circle, and the M-dimensional plane becomes a straight line.

FIG. 1 illustrates that the cross point C of the two straight lines plotted satisfies $$0 < \cos\phi < u_1(C) < \cos\theta < 1 \text{ and } 0 < \sin\theta < u_2(C) < \sin\phi < 1.$$

Depending on whether N or M is larger, three situations can occur, as discussed below.

I. Situation of N=M. If N=M exactly (wherein N is the number of performance targets and M is the number of model parameters), then the M linear algebraic equations (8) will uniquely determine M coordinates $u_1, u_2, \ldots, u_M$.

When all ratios $\alpha_{j1}/\eta_j$ (i=1, 2, ..., N) have the same sign (or being zero), and all ratios $\alpha_{j2}/\eta_j$ (i=1, 2, ..., N) have the same sign (or being zero), etc., the solution will be within [−1, 1] range: $-1 \leq u_j \leq 1$, j=1, 2, ..., M. An example of N=M=2 is illustrated in FIG. 1. Also, the sign of $u_j$ is the same as that of $\alpha_{ij}/\eta_j$.

In summary, for the case of N=M wherein the number N of performance targets equals the number M of model parameters with tolerance, a set of M linear algebraic equations with M unknowns are solved to find, for each of the M model parameters, a shift amount away from a nominal value, the resulting M skewed model parameter values reproduce N skewed performance targets simultaneously.

II. Situation of N>M. If N>M, there are more equations than unknowns, and a least-squares fit method can be used to achieve an optimum set of $u_1, u_2, \ldots, u_M$. Specifically, we want to minimize this target function, $$T(u_1, u_2, \ldots, u_M) = \sum_{i=1}^{M}\left[\left(\sum_{j=1}^{M} \alpha_{ij} u_j\right) - \eta_i\right]^2 \quad (11)$$

Setting each of M first-order derivatives to zero, $$\frac{\partial T}{\partial u_k} = \sum_{i=1}^{N} 2\alpha_{ik}\left[\left(\sum_{i=1}^{M} \alpha_{ij}u_j\right) - \eta_i\right] = 0, \quad k = 1, 2, \ldots, M, \quad (12)$$

we have M linear algebraic equations to determine M unknowns $u_1, u_2, \ldots, u_M$, $$\sum_{j=1}^{M} A_{kj}u_j = B_k, \quad k = 1, 2, \ldots, M, \quad (13)$$

where coefficients $$A_{kj} = \sum_{i=1}^{N} \alpha_{ik}\alpha_{ij}, \quad k, j = 1, 2, \ldots, M \quad (14a)$$

$$B_k = \sum_{i=1}^{N} \eta_i\alpha_{ik}, \quad k = 1, 2, \ldots, M, \quad (14b)$$

Figure 2:
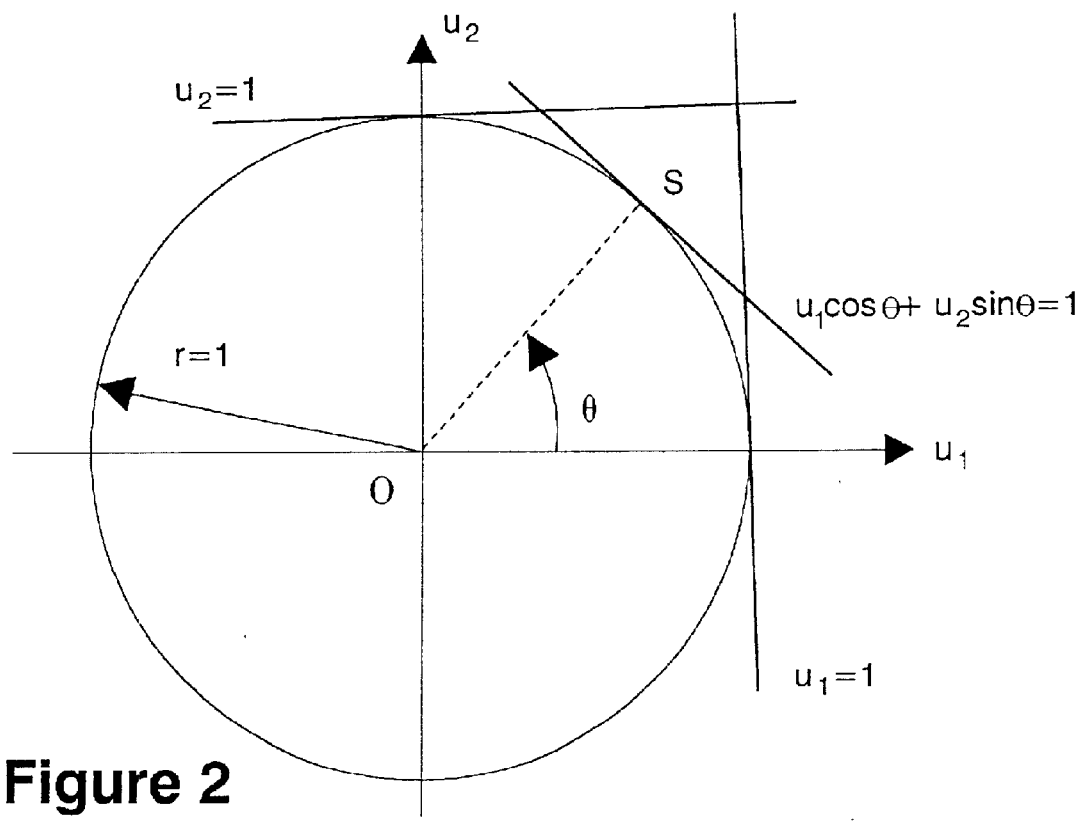
FIG. 2. illustrates that the least-squares solution point S of the three straight lines satisfies $$0<u_1(S), u_2(S)<1.$$

Again, when all ratios $\alpha_{j1}/\eta_j$ (i=1, 2, ..., N) have the same sign (or being zero), and all ratios $\alpha_{j2}/\eta_j$ (i=1, 2, ..., N) have the same sign (or being zero), etc., the solution will be within [−1, 1] range: $-1 \leq u_j \leq 1$, j=1, 2, ..., M. Also, the sign of $u_j$ is the same as that of $\alpha_{ij}/\eta_i$. An example of N=3 and M=2 is illustrated in FIG. 2. The solution point S is located within a triangle formed by 3 straight lines, and thus it satisfies $-1 \leq u_1(S), u_2(S) \leq 1$. For example, when the angle θ is 45 degrees, the coefficients are $A_{11}=A_{22}=3/2$, $A_{12}=A_{21}=1/2$, $B_1=B_2=1+1/2^{1/2}=1.707$, and thus the least-square solution is $u_1(S)=u_2(S)=B_1 2=0.8535$.

FIG. 2 illustrates that the least-squares solution point S of the three straight lines satisfies $$0 < u_1(S), u_2(S) < 1.$$

In summary, for the case of N>M wherein the number N of performance targets is more than the number M of model parameters with tolerance, a least-squares fit method is used to achieve an optimum set of M shift amounts away from their nominal values.

III. Situation of N<M. If N<M, we actually have freedom to choose (M−N) parameters (say, $u_{N+1}, \ldots, u_M$) first and then solve N linear algebraic equations to obtain the rest Of N parameters (say, $u_1, u_2, \ldots, u_N$). The optimum choice, however, is to maximize the joint probability distribution (7) subject to the N constraints as given by Eqs. (8b). In other words, we want to minimize $$\sum_{j=1}^{M} u_j^2$$

under the N restrictions. Mathematically, we minimize the following target function, $$T(u_1, u_2, \ldots, u_M, \lambda_1, \lambda_2, \ldots, \lambda_N) = \sum_{j=1}^{M} u_j^2 + \sum_{i=1}^{N} \lambda_i \left(\sum_{j=1}^{M} \alpha_{ij}u_j - \eta_i\right) \quad (15)$$

Setting each of (M+N) first-order derivatives to zero, $$\frac{\partial T}{\partial u_j} = 2u_j + \sum_{i=1}^{N} \lambda_i\alpha_{ij} = 0, \quad i = 1, 2, \ldots, M, \quad (16a)$$

$$\frac{\partial T}{\partial \lambda_i} = \sum_{j=1}^{M} \alpha_{ij}u_j - \eta_i = 0, \quad i = 1, 2, \ldots, N, \quad (16b)$$

we have (M+N) linear algebraic equations to determine (M+N) unknowns $u_1, u_2, \ldots, u_M, \lambda_1, \lambda_2, \ldots, \lambda_N$. Notice that Eqs. (16b) are just Eqs. (8b).

For example, when M=2 and N=1, we have the case of "one line on a 2D plane". Let the line equation be (see FIG. 1)

$$u_1\cos \phi + u_2\sin \phi = 1. \quad (17)$$

The target function to minimize is now $$T(u_1, u_2, \lambda) = u_1^2 + u_2^2 + \lambda(u_1\cos \phi + u_2\sin \phi - 1).$$

Three equations (since M+N=3) are $2u_1 + \lambda\cos \phi = 0$, $2u_2 + \lambda\sin \phi = 0$, and Eq. (17). The solution is $u_1 = \cos \phi$, $u_2 = \sin \phi$, and $\lambda = -2$, in agreement with FIG. 1.

A typically used method is to skew all model parameters (here $u_1$ and $u_2$) together in the same percentage amount (with respect to individual parameter's best/worst case) through the use of a nominal random number (NRN), namely, $u_1 = u_2 =$ NRN. In terms of FIG. 1, this method corresponds to moving out in 45-degree direction. As FIG. 1 illustrates, this method usually does not give the optimum skew corner.

In general, Eq. (16a) leads to $$u_j = -\frac{1}{2}\sum_{i=1}^{N} \lambda_i\alpha_{ij}, \quad j = 1, 2, \ldots, M \quad (18)$$

Substitution of Eq. (18) into Eq. (16b) gives N algebraic equations for $$\lambda_1, \lambda_2, \ldots, \lambda_N,$$

$$\sum_{k=1}^{N} b_{ik}\lambda_k = -2\eta_i, \quad i = 1, 2, \ldots, N \quad (19)$$

where the coefficients $$b_{ik} = \sum_{j=1}^{M} \alpha_{ij}\alpha_{kj}, \quad i, k = 1, 2, \ldots, N \quad (20)$$

Owing to the unit-length-vector relation (5a), we see that $$b_{ii} = 1, i = 1, 2, \ldots, N, \quad (21a)$$

and $$-1 \leq b_{ik} \leq 1, i, k = 1, 2, \ldots, N, i \neq k \quad (21b)$$

When there is only 1 target. i.e., when N=1, we get from Eq. (18) that $$u_j = -\frac{1}{2}\lambda_1 a_{1j}, \quad j = 1, 2, \ldots, M \quad (22)$$

Also, we obtain from Eqs. (19) and (21a) that $$b_{11}\lambda_1 = \lambda_1 = -2\eta_1 \quad (23)$$

Substitution of Eq. (23) into Eq. (22) gives us solution $$u_j = \eta_1 a_{1j} = \eta_1 \frac{a_{1j}\sigma_j}{\sum_1}, \quad j = 1, 2, \ldots, M, \quad (24)$$

where the second equality is the result of using definition (4). A set of solutions (24) are just Eqs. (9) given previously. Notice that $|u_j| \leq 1$, $j=1, 2, \ldots, M$. Similarly, a set of solutions (24) satisfy unit-length-vector relation (10). Equations (24) also reveal that solution (9) is a set of optimum solutions (for a single target problem), since it maximizes the joint probability distribution. A set of solutions (24) also says that the amount of skewing, $u_j$, for each parameter $X_j$ is proportional to the projection $\alpha_{1j}$ of plane normal direction on the jth axis. In an example of $$M = 4 \text{ with } \alpha_{11} = a_{11}\sigma_1 / \sum_1 = 0.8, \alpha_{12} = a_{12}\sigma_2 / \sum_1 = 0.48,$$

$$\alpha_{13} = a_{13}\sigma_3 / \sum_1 = 0.288, \text{ and } \alpha_{14} = a_{14}\sigma_4 / \sum_i = 0.216,$$

relation (5a) is satisfied. For the case of $\eta_1=1$, the solution is simply $u_1=0.8$, $u_2=0.48$, $u_3=0.288$, and $u_4=0.216$.

If $(u_1, u_2, \ldots, u_M)$ are a set of solutions for 1-σ best/worst case, then $(3u_1, 3u_2, \ldots, 3u_M)$ are the set of solutions for 3-σ best/worst case.

In summary, for the case of N<M wherein the number N of performance targets is less than the number M of model parameters with tolerance, maximize the joint probability distribution of M model parameters under the constraints of satisfying N skewed performance targets simultaneously, the resulting M skewed model parameter values reproduce N skewed performance targets simultaneously and are also a set of optimum skewed model parameter values, to generate an optimum skew corner.

In summary, for N=1 wherein a skew corner is needed for only one performance target, maximize the joint probability of M model parameters under the constraint of reproducing the best or worst case of that performance target, under the constraint of satisfying only one skewed performance target, by shifting the $j^{th}$ (j=1,2, ..., M) of M model parameters by a percentage amount of $+a_{1j}\sigma_j/\Sigma_1$ when the value of the performance target increase in the skewed case, or $-a_{1j}\sigma_j/\Sigma_1$ when the value of the performance target decreases in the skewed case, wherein $a_{1j}$ is the sensitivity of the first performance target with respect to the $j^{th}$ model parameter, σj is the tolerance of the $j^{th}$ model parameter, and $\Sigma_1$ the square root of $[(a_{11}\sigma_1)^2 + (a_{12}\sigma_2)^2 + \ldots + (a_{1M}\sigma_M)^2]$, the tolerance of the first performance target.

The resulting percentage shift amounts, measured with respect to the tolerance of each model parameter's tolerance among M model parameters, are different from one another, and the resulting percentage shift amounts are the same if the relative sensitivities are the same.

In the following, we discuss the generalization of the above results.

A. Opposite model parameter skewing directions for multiile performance targets

In interconnect models, a wider wire has less resistance, but also has larger wiring capacitance. In other words, the best case of wire resistance requires a wider wire, but the best case of wiring capacitance requires a narrower wire, an opposite parameter skewing direction.

Figure 3:
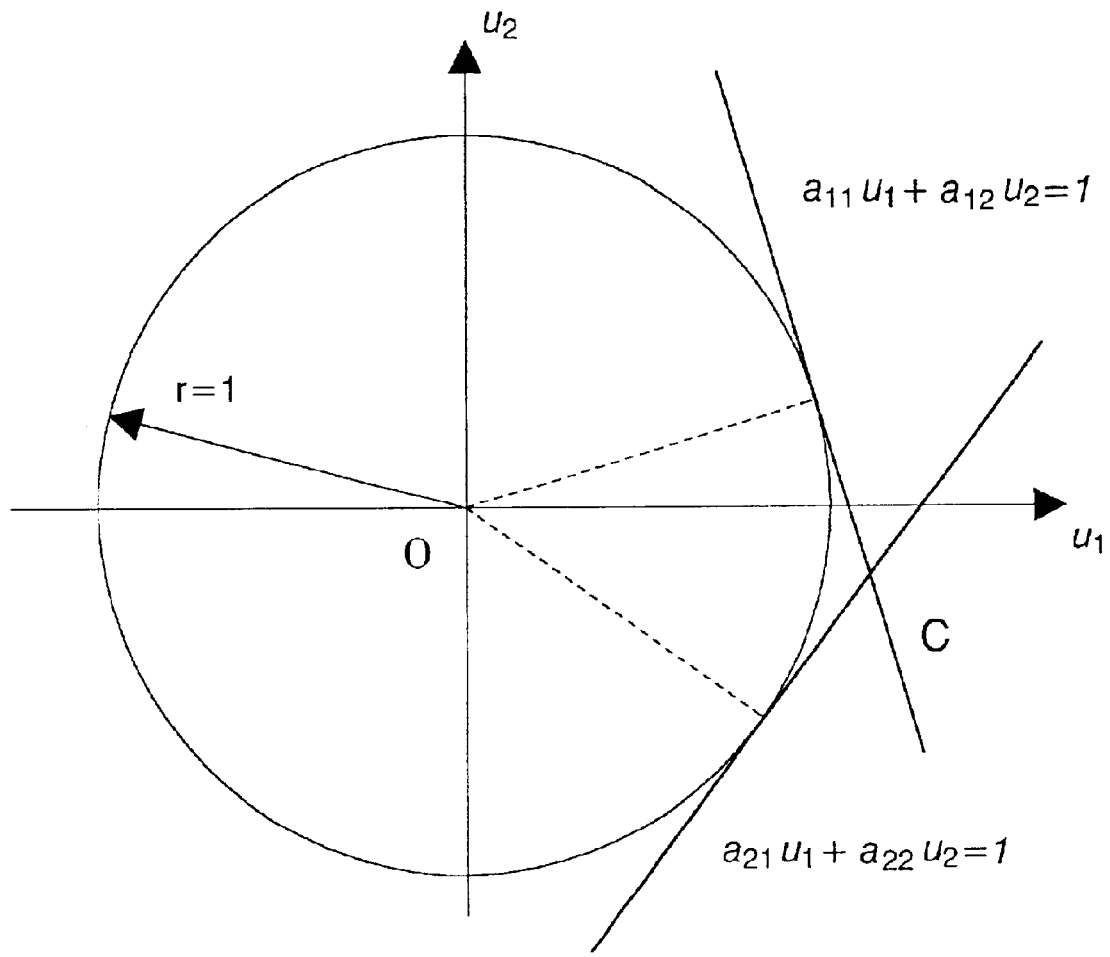
FIG. 3 illustrates an example of N=2 (two targets) and M=2 (two parameters), wherein opposite signs between $a_{12}$ and $a_{22}$ leads to a solution $|u_1(C)|>1$.

FIG. 3 illustrates a case in which two different performance targets lead to $a_{11}$ and $a_{21}$ have the same sign, but $a_{12}$ and $a_{22}$ have opposite signs. The resulting solution is in the region of $|u_1(C)|>1$, which may not be desirable.

Figure 4:
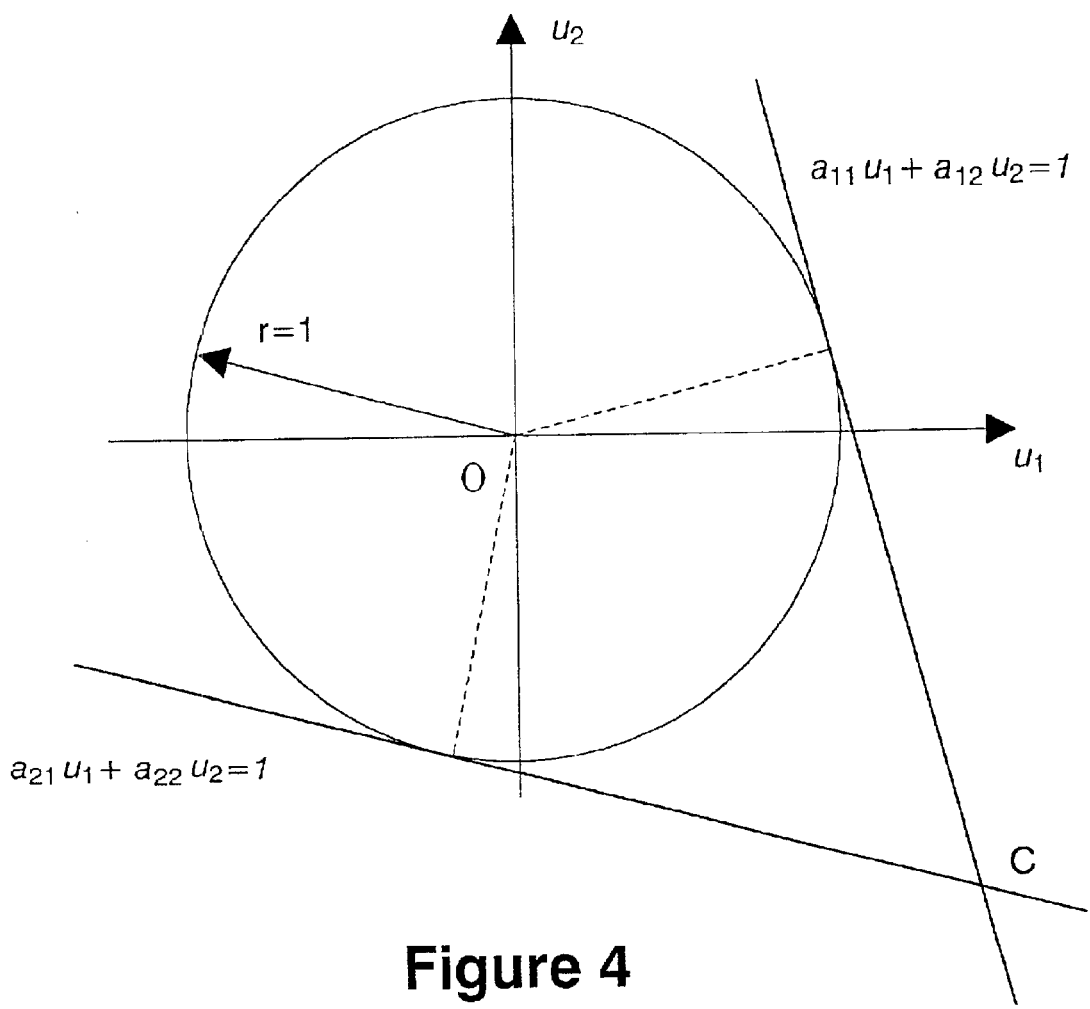
FIG. 4 illustrates an example of N=2 (two targets) and M=2 (two parameters), wherein opposite signs between $a_{11}$ and $a_{21}$ and opposite signs between $a_{12}$ and $a_{22}$ leads to a solution $|u_1(C)|>1$ and $|u_2(C)|>1$.

FIG. 4 shows a further example of N=M=2 with opposite signs between $a_{11}$ and $a_{21}$ and also opposite signs between $a_{12}$ and $a_{22}$. In FIG. 4, both $|u_1(C)|$ and $|u_2(C)|$ are larger than 1. If a result with $|u_j(C)|>1$ is not acceptable, we provide a solution here: to group multiple performance targets into several groups. In each group, all ratios $\alpha_{j1}/\eta_j$ (i=1, 2, ..., N) have the same sign (or being zero), all ratios $\alpha_{j2}/\eta_j$ (i=1, 2, ..., N) have the same sign, etc. After such grouping, an initial case of "N>M" may become $N=N_1+N_2+\ldots$, with $N_1<M$, $N_2<M$, etc. A separate skew corner is provided for each group of performance targets. For each skew corner, we will have the bounded solution of $|u_j(C)| \leq 1$, j=1, 2, ..., M. Also, the sign of $u_j$ is the same as that of $\alpha_{ij}/\eta_i$.

Now, we can summarize the steps used in our method of generating optimum skew corner for a compact device model.

1. Collect a number N of multiple performance targets $F_i$, i=1, 2, ..., N.
2. Identify a number M of model parameters. For each model parameter, its tolerance should be given along with its nominal value in the compact model. Also, for each model parameter, decide if it should be included in the skew-corner analysis or not. For example, when deciding the skew corner for just interconnect wiring resistance and capacitance, there is no need to include the FET model parameter TOX, mobility, Cj, etc. This step determines the number M of involved model parameters.
3. Do a sensitivity analysis for each target. Namely, find coefficients $a_{ij}$ in Eq. (1). Their total number is NM.
4. Decide the sign (and value) of $\eta_i$ for the worst (or best) case of ith target, $F_i$.
5. Divide performance targets into more groups if necessary. After grouping, in each group, all ratios $\alpha_{i1}/\eta_i$ (i=1, 2, ..., N) should have the same sign (or being zero), all ratios $\alpha_{j2}/\eta_i$ (i=1, 2, ..., N) have the same sign, etc. For example, in the case of an interconnect model, the worst case of resistance R, the best case of capacitance C, and the worst case of the product RC belong to one group, where as the best case of resistance R, the worst case of capacitance C, and the best case of the product RC belong to another group.
6. For each group, decide whether it belongs to situation I, II, or III discussed above. Specifically, this is done by comparing the number of targets N in the group and its relation to the number of model parameter number M.
7. For each group, calculate a separate skew corner using the corresponding method for the situation. The results are the bounded solution of $|u_j| \leq 1$, j=1, 2, ..., M, with the sign of $u_j$ being the same as that of $\alpha_{ij}/\eta_i$.

FIG. 3 illustrates an example of N=2 (two targets) and M=2 (two parameters), wherein opposite signs between $a_{12}$ and $a_{22}$ leads to a solution $|u_1(C)|>1$.

FIG. 4 illustrates an example of N=2 (two targets) and M=2 (two parameters), wherein opposite signs between $a_{11}$ and $a_{21}$ and opposite signs between $a_{12}$ and $a_{22}$ leads to a solution $|u_1(C)|>1$ and $|u_2(C)|>1$.

B. NFET and PFET difference and correlation

A model parameter $X_j$ [e.g., effective Tox, $\Delta L$, $\Delta W$, Vt, Cj, etc.] for NFET and that PFET often have different nominal values $X_{jN0}$ and $X_{jP0}$ and, sometime, even different standard deviations $\sigma_{jN}$ and $\sigma_{jP}$. Since, say, Tox for NFET and Tox for PFET are highly correlated, it is important to treat Tox (NFET) and Tox(PFET) as two separate variables $X_{jN}$ and $X_{jP}$ that are highly correlated. In other words, TOX(NFET) and Tox(PFET) should be tied together somehow. The correct treatment goes like this.

Equation (1) is generalized to:

$$F_i = F_{i0} + \sum_{j=1}^{M} a_{ij}(x_{jN} - x_{jN0}) + \sum_{j=1}^{M} b_{ij}(x_{jP} - x_{jP0}), \ i = 1, 2, \ldots, N \quad (25)$$

Under the assumption that $X_{jN}$ and $X_{jP}$ are fully correlated, we mean that, when $X_{jN}=X_{jN0}$, one has $X_{jP}=X_{jP0}$ and that, when $X_{jN}=X_{jN0}+/-\sigma_{jN}$, one also has $X_{jP}=X_{jP0}+/-\sigma_{jP}$. Quantitatively, the complete correlation of $X_{jN}$ and $X_{jP}$ means that $$u_j = (X_{jN} - X_{jN0})/\sigma_{jN} = (X_{jP} - X_{jP0})/\sigma_{jP} \quad (26)$$

Substitution Of Eq. (26) into Eq. (25) gives $$F_i = F_{i0} + \sum_{j=1}^{M} (a_{ij}\sigma_{iN} + b_{ij}\sigma_{jP})u_j, \quad i = 1, 2, \ldots, N, \quad (27)$$

Equation (3) is generalized to $$\sum_i^2 = \sum_{j=1}^{M} [(a_{ij}\sigma_{jN})^2 + (b_{ij}\sigma_{jP})^2], \quad i = 1, 2, \ldots, N \quad (28)$$

Equation (4) is now generalized to $$\alpha_{ij} = \frac{1}{\sum_i} \sqrt{(a_{ij}\sigma_{jN})^2 + (b_{ij}\sigma_{jP})^2}, \quad i = 1, 2, \ldots, N \quad (29)$$

After Eq. (29), previously written Eqs. (5), (7)-(24) are all valid.

Figure 5:
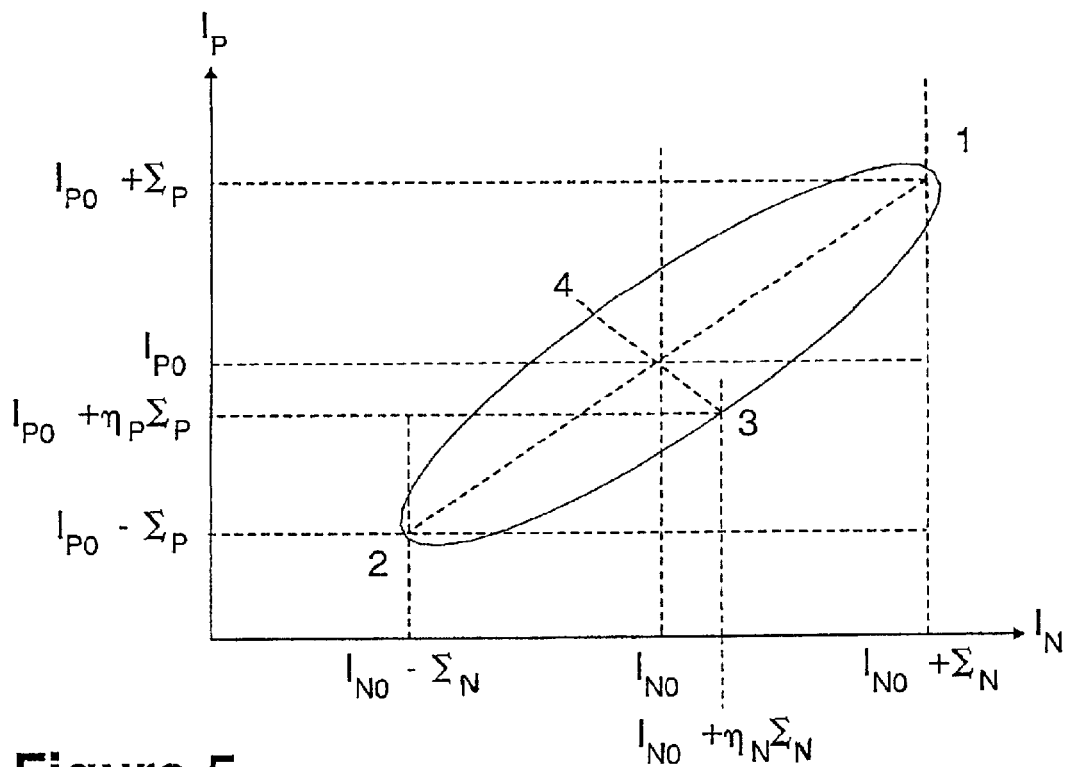
FIG. 5 illustrates several skew corners for the saturation current of a pair of NFET and PFET devices.

FIG. 5 illustrates several skew corners for the saturation current of a pair of NFET and PFET devices, wherein 1 designates the fast-NFET-fast-PFET skew corner, 2 designates the slow-NFET-slow-PFET skew corner, 3 designates the fast-NFET-slow-PFET skew corner, and 4 designates the slow-NFET-faSt-PFET skew corner.

C. Fast-NFET-Slow-PFET skew corner and Slow-NFET-Fast-PFET skew corner.

A fast-NFET-fast-PFET skew corner usually means $$I_N = I_{N0} + \sum_N \quad \text{and} \quad I_P = I_{P0} + \sum_P,$$

and similarly a "slow-NFET-slow-PFET" skew corner implies $$I_N = I_{N0} - \sum_N \quad \text{and} \quad I_P = I_{P0} - \sum_P.$$

However, a "fast-NFET-slow-PFET" skew corner does not mean $$I_N = I_{N0} - \sum_N \quad \text{and} \quad I_P = I_{P0} - \sum_P.$$

Rather, it means that $$I_N = I_{N0} + \eta_N \sum_N \quad \text{and} \quad I_P = I_{P0} + \eta_P \sum_P \quad \text{with} \ 0 < \eta_N < 1 \ \text{and} \ -1 < \eta_P < 0$$

(say, $\eta_N = -\eta_P = 0.4$). For the more general case in which $$F_i = F_{i0} + \eta_N \sum_i, \ i = 1, 2, \ldots, N, \eta_i$$

in Eqs. (8), (9), (11), (12), (14b), (15), (16b), (19), (23), and (24) can be in the range of [−1, 1].

Figure 6:
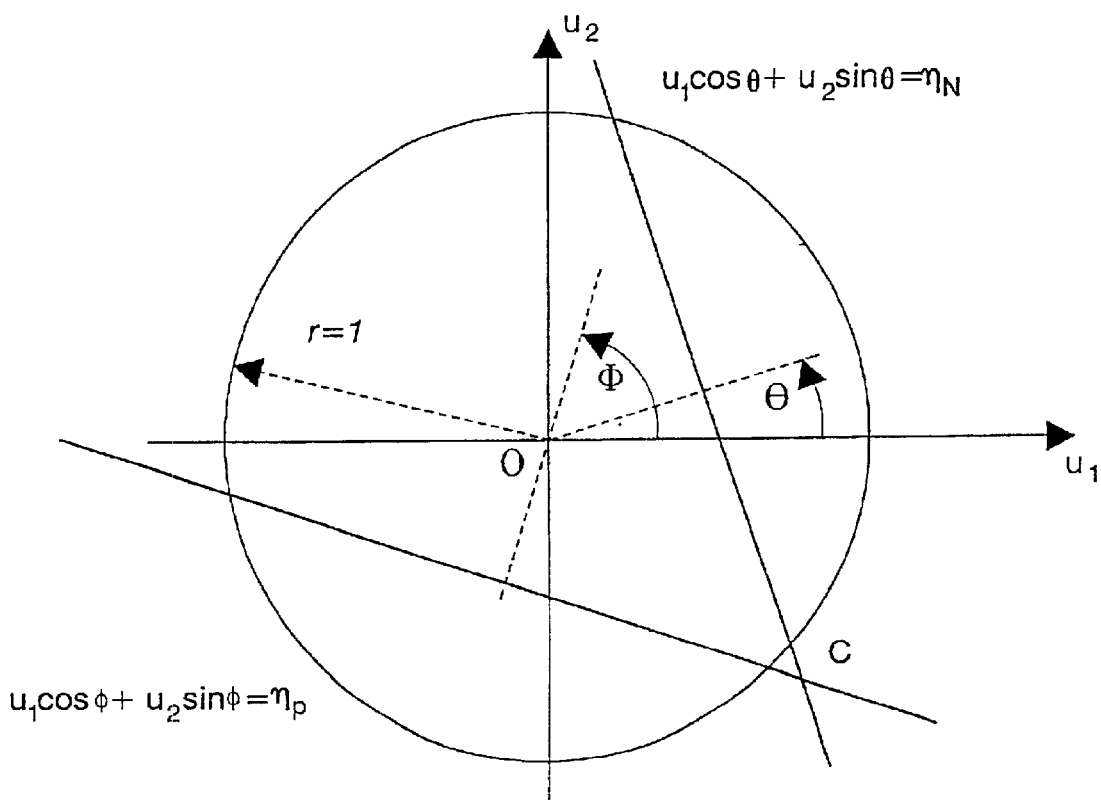
FIG. 6 illustrates an example of the skew corner of a fast NFET and slow PFET.

FIG. 6 is an example of a fast-NFET-slow-PFET skew corner. It shows that, with $0<\eta_N<1$ and $-1<\eta_P<0$, one can get $0<u_1(C)<1$ and $-1<u_2(C)<1$, as desired. ($u_1$ corresponds to $I_N$ in FIG. 5, and $u_2$ corresponds to $I_P$ in FIG. 5).

D. Original FET Parameters are not mutually independent.

The joint probability distribution (2) can be generalized and be written as $$P(x_1, x_2, \ldots, x_M) = const \cdot \exp\left[-\frac{1}{2}\sum_{i,j=1}^{M} \frac{\varepsilon_{ij}(x_i - x_{i0})(x_j - x_{j0})}{\sigma_i \sigma_j}\right], \quad (30)$$

where $\epsilon_{ij}=\epsilon_{ji}$ and $\epsilon_{ii}=1$. Un-correlated distribution (2) is a special case of more general distribution (30) with $\epsilon_{ij}=0$ for $i \neq j$. In the shifted-and-scaled coordinate system, distribution (30) becomes $$P(u_1, u_2, \ldots, u_M) = const \cdot \exp\left[-\frac{1}{2}\sum_{i,j=1}^{M} \varepsilon_{ij} u_i u_j\right], \quad (31)$$

Further, Eq. (15) is generalized to $$T(u_1, u_2, \ldots, u_M, \lambda_1, \lambda_2, \ldots, \lambda_N) = \sum_{i,j=1}^{M} \varepsilon_{ij} u_i u_j + \sum_{i=1}^{N} \lambda_i \sum_{j=1}^{M} (\alpha_{ij} u_j - \eta_i), \quad (32)$$

and Eq. (16a) becomes $$\frac{\partial T}{\partial u_j} = 2\sum_{i=1}^{M} \varepsilon_{ij} u_i + \sum_{i=1}^{N} \lambda_i \alpha_{ij} = 0, \quad j = 1, 2, \ldots, M \quad (33)$$

Now, Eqs. (8b) and (33) determines (M+N) parameters $u_1, u_2, \ldots, u_M$ and $\lambda_1, \lambda_2, \ldots, \lambda_N$.

E. Second-order approximation.

If quadratic response surfaces (second-order expansions) are used to replace Eqs. (1), then Eqs. (8) will also be replaced by quadratic expressions. [Similarly, the multiplier on $\lambda_k$ in Eq. (15) will also be quadratic.] As mentioned at the beginning of the discussion, the above first-order solution will serve as the starting point of an iteration solution process. interconnect model, wherein:

F. Interconnect Models

For a first interconnect model: a first skew corner model is constructed for the worst case of resistance R; a second skew corner model is constructed for the best case of capacitance C; a third skew corner model is constructed for the worst case of the product RC; a fourth skew corner model is constructed for simultaneously the worst case of resistance R and the best case of capacitance C; and a fifth skew corner model is generated for simultaneously the worst case of resistance R, the best case of capacitance C, and the worst case of the product RC.

For a second interconnect model: a first skew corner model is constructed for the best case of resistance R; a second skew corner model is constructed for the worst case of capacitance C; a third skew corner model is constructed for the best case of the product RC; a fourth skew corner model is constructed for simultaneously the best case of resistance R and the worst case of capacitance C; and a fifth skew corner model is generated for simultaneously the best case of resistance R, the worst case of capacitance C, and the best case of the product R.

While several embodiments and variations of the present invention for a method of generating optimum skew corners for a compact device model are described in detail herein, it should be apparent that the disclosure and teachings of the present invention will suggest many alternative designs to those skilled in the art.

I claim:

1. A method for generating optimum skew corners for a compact device model, comprising the steps of:

collecting a number N of multiple performance targets $F_i$, wherein i=1, 2, . . . N;

identifying a number M of model parameters to be included in a skew corner analysis, and for each model parameter its tolerance and its nominal value in the compact device model;

for each said performance target $F_i$, doing a sensitivity analysis and finding N sensitivity coefficients $a_{ij}$, wherein J=1, 2, . . . , M;

for each said performance target $F_i$, setting a sign and value of a parameter $\eta_i$ for a skew corner case to $\eta_i=1$ if a value of the target $F_i$ increases in the skew corner case and to $\eta_i=-1$ if the value of the target $F_i$ decreases in the skew corner case;

classifying performance targets into groups;

for each group, comparing the number of targets N in the group and its relation to the number of model parameters M; and for each group, calculating a skew corner coordinate based on the relationship between the number of targets N and the number of model parameters M.

2. The method of claim 1, wherein the skew corner case comprises a worst or slow case.

3. The method of claim 1, wherein the skew corner case comprises a best or fast case.

4. The method of claim 1, wherein the skew corner case comprises a fast-NFET-slow-PFET skew corner.

5. The method of claim 1, wherein in the step of classifying performance targets into groups, denoting in each group the performance targets within the $k^{th}$ group as $i_{k1}$, $i_{k2}$, . . . , $i_{kN}$, wherein $a_{i1}$ and $a_{i2}$ are coefficients obtained by evaluating the compact device model, and all ratios $a_{i1}/\eta_i$, for i=$i_{k1}, i_{k2}, \ldots, i_{kN}$ have the same sign or are zero, and all ratios $a_{i2}/\eta_i$, for i=$i_{k1}, i_{k2}, \ldots, i_{kN}$ have the same sign or are zero.

6. The method of claim 1, wherein the step of comparing further comprising determining if N=M, or N>M, or N<M, wherein M is the number of model parameters.

7. The method of claim 1, wherein the compact device model comprises an FET device.

8. The method of claim 7, wherein the model parameters include TOX-oxide thickness, $\Delta L$—the difference between drawn design length and actual electrical length, $\Delta W$—the difference between the design width of the FET device and the actual electrical width of the FET device, threshold voltage, mobility, and junction capacitance.

9. The method of claim 1, wherein the compact device model comprises a passive device.

10. The method of claim 9, wherein the passive device comprises a resistor, and the model parameters include sheet resistance of the resistor, the resistor temperature coefficient, resistor length, and resistor width.

11. The method of claim 1, wherein the compact device model comprises an interconnect model.

12. The method of claim 6, wherein the compact device model is for an integrated circuit having a plurality of metal levels, and the model parameters include wire length, wire width, wire thickness, wire-to-wire space in a same metal level, vertical distance to a next metal level above, and vertical distance to a next metal level below, vertical distance to a substrate/N-well/diffusion region below.

13. The method of claim 11, further comprising:

constructing a first skew corner model for a worst case of resistance R;

constructing a second skew corner model for a best case of capacitance C;

constructing a third skew corner model for a worst case of the product RC;

constructing a fourth skew corner model for simultaneously the worst case of resistance R and the best case of capacitance C;

generating a fifth skew corner model for simultaneously the worst case of resistance R, the best case of capacitance C, and the worst case of the product RC.

14. The method of claim 11, wherein:

constructing a first skew corner model for a best case of resistance R;

constructing a second skew corner model for a worst case of capacitance C;

constructing a third skew corner model for a best case of the product RC;

constructing a fourth skew corner model for simultaneously the best case of resistance R and the worst case of capacitance C;

generating a fifth skew corner model for simultaneously the best case of resistance R, the worst case of capacitance C, and the best case of the product R.

15. The method of claim 6, wherein for the case of N=M wherein the number N of performance targets equals the number M of model parameters with tolerance, solving a set of M linear algebraic equations with M unknowns to find, for each of the M model parameters, a shift amount away from a nominal value, with a resulting M skewed model parameter values reproducing N skewed performance targets simultaneously.

16. The method of claim 6, wherein for the case of N>M wherein the number N of performance targets is more than the number M of model parameters with tolerance, using a least-squares fit method to achieve an optimum set of M shift amounts away from their nominal values.

17. The method of claim 6, wherein for the case of N<M wherein the number N of performance targets is less than the number M of model parameters with tolerance, maximizing the joint probability distribution of M model parameters under the constraints of satisfying N skewed performance targets simultaneously, the resulting M skewed model parameter values reproducing N skewed performance targets simultaneously and also a set of optimum skewed model parameter values, generating an optimum skew corner.

18. The method of claim 17, wherein for N=1 wherein a skew corner is needed for only one performance target, maximizing the joint probability of M model parameters under the constraint of reproducing the best or worst case of that performance target, under the constraint of satisfying only one skewed performance target, by shifting the $j^{th}$ (j=1, 2, ..., M) of M model parameters by a percentage amount of $+a_{1j}\ _{oj}/\Sigma_1$ when the value of the performance target increase in the skewed case, or by a percentage amount of $-a_{1j oj}/\Sigma_1$ when the value of the performance target decreases in the skewed case, wherein $a_{1j}$ is the sensitivity of the first performance target with respect to the $j^{th}$ model parameter, $\sigma_j$ is the tolerance of the $j^{th}$ model parameter, and $\Sigma_1$=the square root of $[(a_{1jo1})^2+(a_{12o2})^2+\ .\ .\ .\ +(a_{1M oM})^2]$, the tolerance of the first performance target.

19. The method of claim 18, wherein the resulting percentage shift amounts, measured with respect to the tolerance of each model parameter's tolerance among M model parameters, are different from one another, and the resulting percentage shift amounts are the same if the relative sensitivities are the same.

* * * * *